US006815760B2

(12) United States Patent
Leung et al.

(10) Patent No.: US 6,815,760 B2
(45) Date of Patent: Nov. 9, 2004

(54) NONVOLATILE MEMORY STRUCTURES AND FABRICATION METHODS

(75) Inventors: Chung Wai Leung, Milpitas, CA (US); Chia-Shun Hsiao, Cupertino, CA (US); Vei-Han Chan, San Jose, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 84 days.

(21) Appl. No.: 10/200,443

(22) Filed: Jul. 22, 2002

(65) Prior Publication Data

US 2003/0067031 A1 Apr. 10, 2003

Related U.S. Application Data

(62) Division of application No. 09/969,841, filed on Oct. 2, 2001.

(51) Int. Cl.$^7$ .............................................. H01L 29/788
(52) U.S. Cl. ...................................................... 257/316
(58) Field of Search ................................. 257/316–321

(56) References Cited

U.S. PATENT DOCUMENTS

| | | | |
|---|---|---|---|
| 4,794,565 A | 12/1988 | Wu et al. | 365/185 |
| 5,029,130 A | 7/1991 | Yeh | 365/185 |
| 5,045,488 A | 9/1991 | Yeh | 437/43 |
| 5,067,108 A | 11/1991 | Jenq | 365/185 |
| 5,120,671 A | 6/1992 | Tang et al. | 437/43 |
| 5,202,850 A | 4/1993 | Jenq | 365/185 |
| 5,212,541 A | 5/1993 | Bergemont | 257/319 |
| 5,217,920 A | 6/1993 | Mattox et al. | 437/67 |
| 5,242,848 A | 9/1993 | Yeh | 437/43 |
| 5,264,387 A | 11/1993 | Beyer et al. | 437/62 |
| 5,278,087 A | 1/1994 | Jenq | 437/43 |
| 5,376,571 A | 12/1994 | Bryant et al. | 438/257 |
| 5,376,573 A | 12/1994 | Richart et al. | 437/48 |
| 5,399,516 A | 3/1995 | Bergendahl et al. | 437/43 |
| 5,427,966 A * | 6/1995 | Komori et al. | 438/257 |
| 5,479,368 A | 12/1995 | Keshtbod | 365/185.01 |
| 5,484,741 A * | 1/1996 | Bergemont | 438/257 |

(List continued on next page.)

OTHER PUBLICATIONS

Shimizu, K. et al., "A Novel High–Density 5F$^2$ NAND STI Cell Technology Suitable for 256Mbit and Gbit Flash Memories," (IEEE Tech. Dig., Dec. 7–10, 1997, pp. 271–274), pp. 11.1–11.1.4.

S. Aritome, S. Satoch, T. Maruyama, H. Watanabe, S. Shuto, G.J. Hemink, R. Shirota, S. Watanabe and F. Masuoka, "A 0.67 mm$^2$ Self–Aligned Shallow Trench Isolation Cell (SA–STI Cell) For 3V—only 256Mbit Nand EEPROMs". (IEDM Tech. Dig. Dec. 11–14, 1994, pp. 61–64). pp. 3.6.1–3.6.4.

(List continued on next page.)

Primary Examiner—Richard A. Booth
(74) Attorney, Agent, or Firm—Michael Shenker; MacPherson Kwok Chen & Heid LLP

(57) ABSTRACT

To fabricate a semiconductor memory, one or more pairs of first structures are formed over a semiconductor substrate. Each first structure comprises (a) a plurality of floating gates of memory cells and (b) a first conductive line providing control gates for the memory cells. The control gates overlie the floating gates. Each pair of the first structures corresponds to a plurality of doped regions each of which provides a source/drain region to a memory cell having the floating and control gates in one or the structure and a source/drain region to a memory cell having floating and control gates in the other one of the structures. For each pair, a second conductive line is formed whose bottom surface extends between the two structures and physically contacts the corresponding first doped regions. In some embodiments, the first doped regions are separated by insulation trenches. The second conductive line may form a conductive plug at least partially filling the region between the two first structures.

12 Claims, 20 Drawing Sheets

U.S. PATENT DOCUMENTS

| | | | |
|---|---|---|---|
| 5,543,339 A | 8/1996 | Roth et al. | 437/43 |
| 5,576,232 A | 11/1996 | Hong | 437/43 |
| 5,587,332 A | 12/1996 | Chang et al. | 437/43 |
| 5,616,941 A | 4/1997 | Roth et al. | 257/315 |
| 5,631,179 A | 5/1997 | Sung et al. | 438/264 |
| 5,640,031 A | 6/1997 | Keshtbod | 257/315 |
| 5,661,053 A | 8/1997 | Yuan | 437/43 |
| 5,668,757 A | 9/1997 | Jenq | 365/185.1 |
| 5,696,019 A | 12/1997 | Chang | 437/67 |
| 5,712,179 A | 1/1998 | Yuan | 437/43 |
| 5,741,719 A | 4/1998 | Kim | 438/257 |
| 5,763,309 A | 6/1998 | Chang | 438/262 |
| 5,770,501 A | 6/1998 | Hong | 438/264 |
| 5,776,787 A | 7/1998 | Keshtbod | 437/43 |
| 5,783,471 A | 7/1998 | Chu | 438/257 |
| 5,792,695 A * | 8/1998 | Ono et al. | 438/257 |
| 5,821,143 A | 10/1998 | Kim et al. | 438/267 |
| 5,851,879 A | 12/1998 | Lin et al. | 438/257 |
| 5,856,943 A | 1/1999 | Jeng | 365/185.14 |
| 5,909,628 A | 6/1999 | Chatterjee et al. | 438/424 |
| 5,912,843 A | 6/1999 | Jeng | 365/185.14 |
| 5,943,261 A | 8/1999 | Lee | 365/185.14 |
| 5,953,255 A | 9/1999 | Lee | 365/185.29 |
| 5,965,913 A | 10/1999 | Yuan et al. | 257/321 |
| 5,977,584 A | 11/1999 | Kim | 257/315 |
| 5,991,204 A | 11/1999 | Chang | 365/185.29 |
| 6,001,706 A | 12/1999 | Tan et al. | 438/424 |
| 6,013,551 A | 1/2000 | Chen et al. | 438/264 |
| 6,025,229 A | 2/2000 | Hong | 438/264 |
| 6,028,336 A | 2/2000 | Yuan | 257/315 |
| 6,043,536 A | 3/2000 | Numata et al. | 257/347 |
| 6,054,355 A | 4/2000 | Inumiya et al. | 438/296 |
| 6,057,572 A | 5/2000 | Ito et al. | 257/296 |
| 6,057,575 A | 5/2000 | Jenq | 257/319 |
| 6,066,544 A | 5/2000 | Pan et al. | 438/424 |
| 6,087,208 A | 7/2000 | Krivokapic et al. | 438/183 |
| 6,103,592 A | 8/2000 | Levy et al. | 438/424 |
| 6,165,692 A | 12/2000 | Kanai et al. | 430/311 |
| 6,166,415 A | 12/2000 | Sakemi et al. | 257/372 |
| 6,169,012 B1 | 1/2001 | Chen et al. | 438/427 |
| 6,171,910 B1 | 1/2001 | Hobbs et al. | 438/275 |
| 6,171,971 B1 | 1/2001 | Natzle | 438/706 |
| 6,171,976 B1 | 1/2001 | Cheng | 438/760 |
| 6,177,303 B1 | 1/2001 | Schmitz et al. | 438/194 |
| 6,191,001 B1 | 2/2001 | Chen et al. | 438/427 |
| 6,191,049 B1 | 2/2001 | Song | 438/758 |
| 6,191,444 B1 | 2/2001 | Clampitt et al. | 257/315 |
| 6,355,524 B1 | 3/2002 | Tuan et al. | 438/257 |

OTHER PUBLICATIONS

William D. Brown, Joe E. Brewer, "Nonvolatile Semiconductor Memory Technology" "A Comprehensive Guide to Understanding and Using NVSM Devices", (IEEE Press series on microelectronic systems 1998), pp. 21–23.

Rebecca Mih et al., "0.18um Modular Triple Self–Aligned Embedded Split–Gate Flash Memory", 2000 Symposium on VLSI Technology, Digest of Technical Papers.

K. Naruke, S. Yamada, E. Obi, S. Taguchi, and M. Wada, "A New Flash–Erase EEProm Cell With A Sidewall Select–Gate On Its Source Side", (IEDM Tech. Dig. Dec. 3–6, 1989, PP, 603–606), pp. 25.7.1–25.7.4.

K. Shimizu, K. Narita, H. Watanabe, E. Kamiya, Y. Takeuchi, T. Yaegashi, S. Aritome, and T. Watanabe, "A Novel High–Density $5F^2$ NAND STI Cell Technology Suitable for 256Mbit and 1 Gbit Flash Memories", (IEEE Tech. Dig. Dec. 7–10, 1997, pp. 271–274), pp. 11.1.1–11.1.4.

Riichiro Shirota, "A Review of 256Mbit NAND Flash Memories and NAND Flash Future Trend", (Microelectronics Engineering Laboratory), unknown date before Aug. 15, 2000, pp. 22–31.

A.T. Wu, T.Y. Chan, P.K. Ko and C. Hu, "A Novel High–Speed, 5–Volt Programming Eprom Structure With Source–Side Injection", (IEDM Tech. Dig., pp. 584–587, 1986), pp. 108–111.

* cited by examiner

NONVOLATILE MEMORY STRUCTURES AND FABRICATION METHODS

CROSS REFERENCE TO RELATED APPLICATIONS

The present application is a division of U.S. patent application Ser. No. 09/969,841 filed Oct. 2, 2001, incorporated herein by reference.

BACKGROUND OF THE INVENTION

The present invention relates to semiconductor technology, and more particularly to nonvolatile memories.

FIGS. 1–8 illustrate fabrication of a conventional nonvolatile stacked-gate flash memory described in U.S. Pat. No. 6,013,551 issued Jan. 11, 2000 to J. Chen et al. Silicon oxide layer 108 ("tunnel oxide") is grown on P-type silicon substrate 150. Doped polysilicon 124 is deposited over oxide 108. Polysilicon 124 will provide floating gates for memory cell transistors.

Mask 106 is formed over the structure. Polysilicon 124, oxide 108, and substrate 150 are etched through the mask openings. Trenches 910 are formed in the substrate as a result (FIG. 2).

As shown in FIG. 3, the structure is covered with dielectric which fills the trenches. More particularly, silicon oxide 90 is grown by thermal oxidation. Then silicon oxide 94 is deposited by PECVD (plasma enhanced chemical vapor deposition). Then thick silicon oxide layer 96 is deposited by SACVD (subatomspheric chemical vapor deposition).

The structure is subjected to chemical mechanical polishing (CMP). Polysilicon 124 becomes exposed during this step, as shown in FIG. 4.

As shown in FIG. 5, ONO (silicon oxide, silicon nitride, silicon oxide) layer 98 is formed on the structure. Silicon 99 is deposited on top. Then tungsten silicide 100 is deposited.

Then a mask is formed (not shown), and the layers 100, 99, 98, 124 are patterned (FIG. 6). Layer 124 provides floating gates, and layers 99, 100 provide control gates and wordlines.

Then mask 101 is formed over the structure, as shown in FIG. 8. Silicon oxide etch removes those portions of oxide layers 90, 94, 96 which are exposed by mask 101. After the etch, the mask remains in place, as dopant is implanted to form source lines 103.

Other implantation steps are performed to properly dope the source and drain regions.

Alternative memory structures and fabrication methods are desirable.

SUMMARY

To fabricate a semiconductor memory, one or more pairs of first structures are formed over a semiconductor substrate. Each first structure comprises (a) a plurality of floating gates of memory cells and (b) a first conductive line providing control gates for the memory cells. The control gates overlie the floating gates. Each pair of the first structures corresponds to a plurality of doped regions each of which provides a source/drain region to a memory cell having the floating and control gates in one of the structures and a source/drain region to a memory cell having floating and control gates in the other one of the structures. For each pair, a second conductive line is formed whose bottom surface extends between the two structures and physically contacts the corresponding first doped regions. In some embodiments, the first doped regions are separated by insulation trenches. The second conductive line may form a conductive plug at least partially filling the region between the two first structures.

Other features and advantages of the invention are described below. The invention is defined-by the appended claims.

Figure 1:
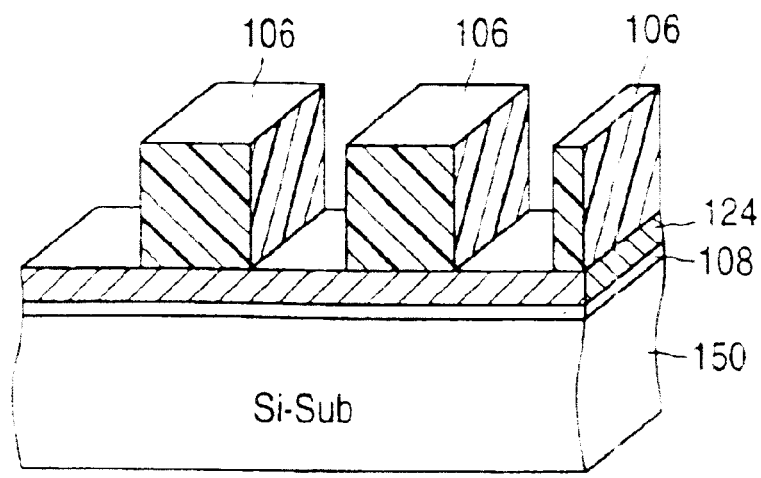
FIGS. 1–7 are cross section illustrations of a prior art flash memory at different stages of fabrication.
Figure 2:
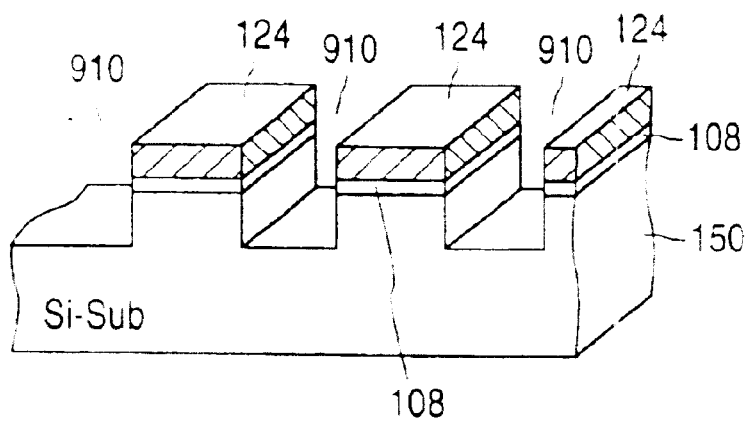
Figure 3:
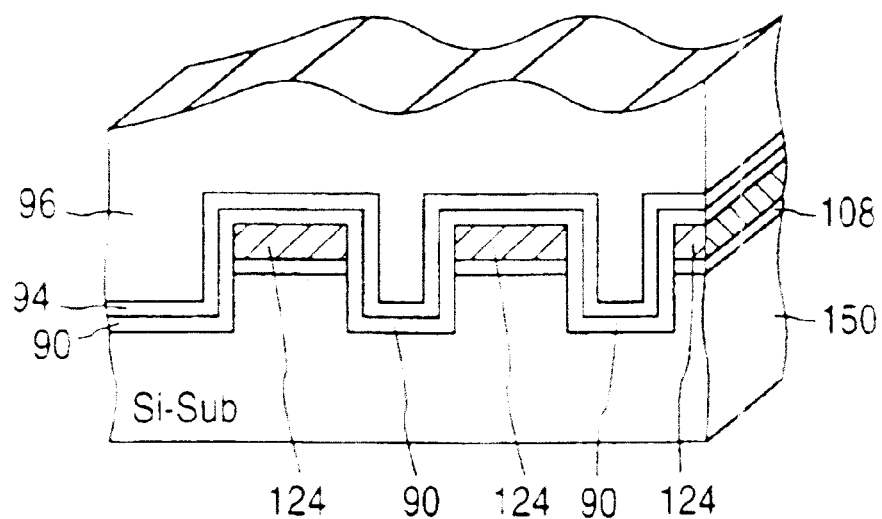
Figure 4:
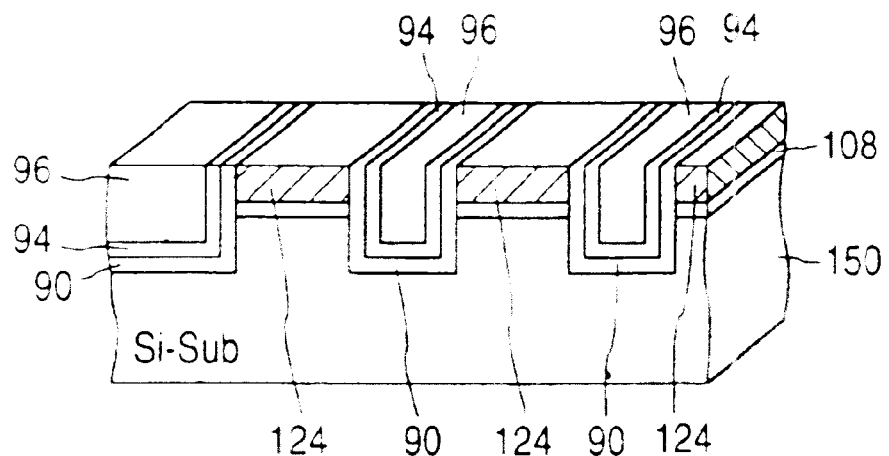
Figure 5:
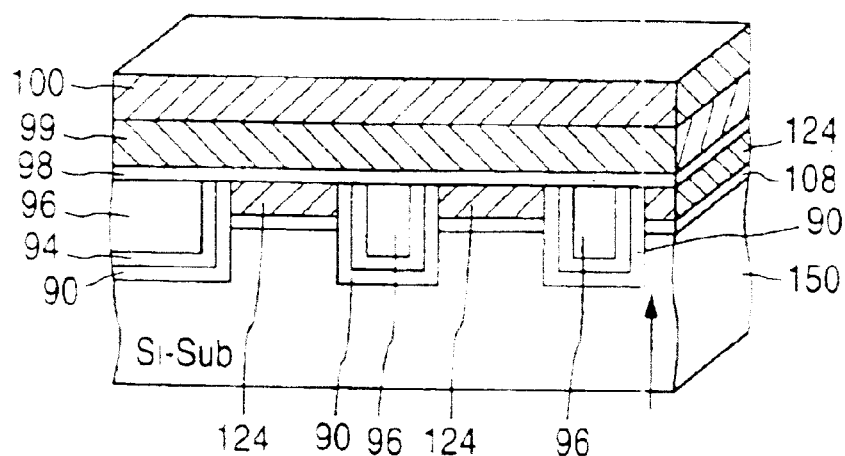
Figure 6:
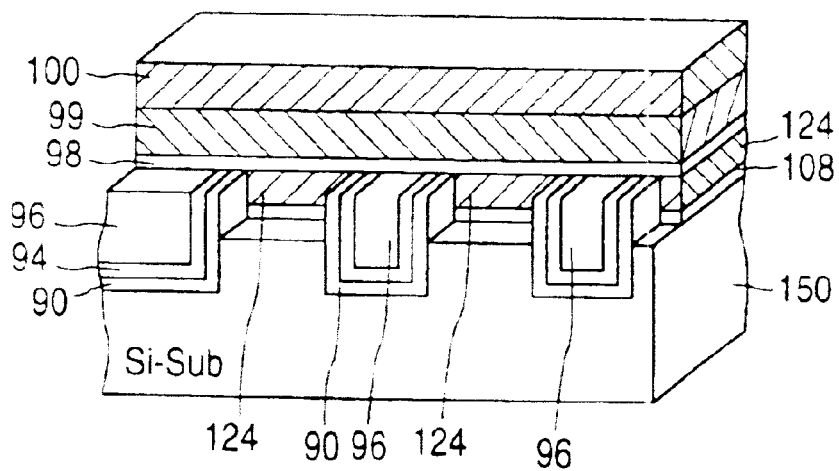
Figure 7:
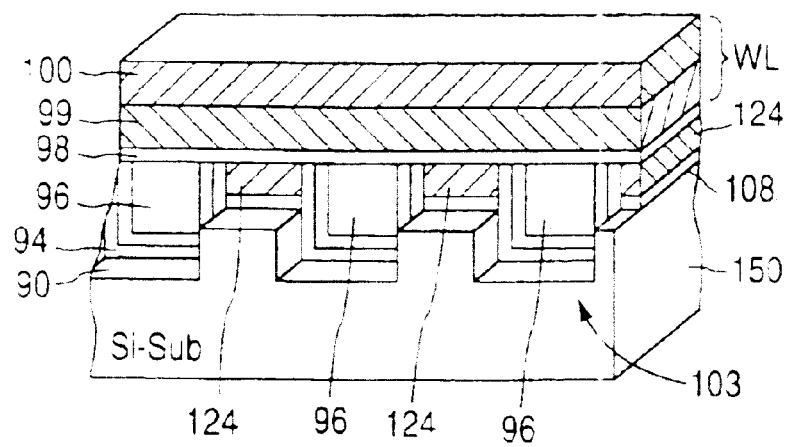
Figure 8:
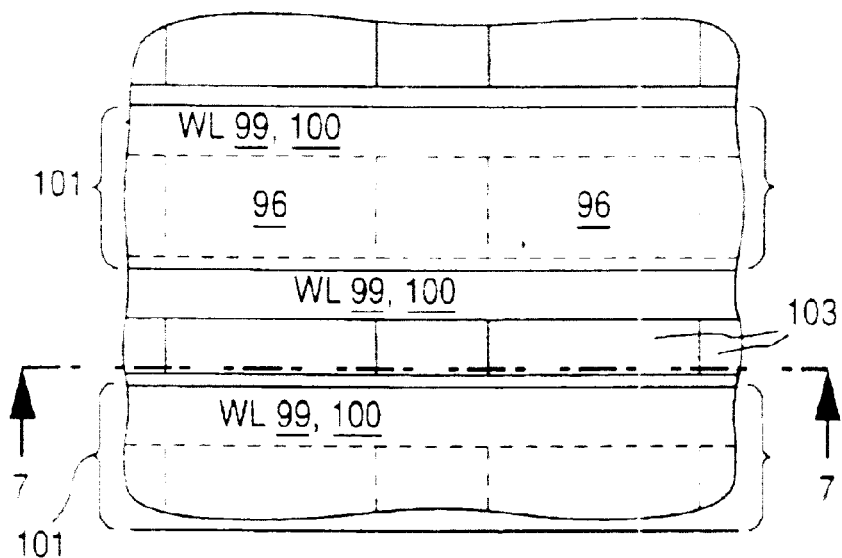
FIG. 8 is a top view of the memory of FIGS. 1–7.

In the drawings, the reference numbers are used as indicated in the following table. The list of the reference numbers in this table is not exhaustive. The description of the features is not complete, and is not limiting. For example, silicon dioxide can be replaced with other insulators. Not all of the functions described for a reference number have to be present in the invention, and also functions not described can be present.

| Reference Number | Feature |
| --- | --- |
| 98 | Insulator isolating the floating gates 124 from the control gates 128 |
| 108 | Tunnel oxide |
| 124 | Floating gates |
| 128 | Control gates |
| 130 | Bitlines |
| 134 | Bitline regions of memory cells |
| 138 | Bitline contacts to memory cells |
| 144 | Source line regions (doped regions in the substrate) |
| 150 | Isolated substrate region |
| 520S | Polysilicon source lines |
| 520W | Wordlines |
| 710 | Stacks including the floating and control gates |
| 720 | Silicon nitride at the top of stacks 710 |
| 903 | Silicon nitride on sidewalls of stacks 710 |
| 904 | Photoresist mask used to pattern the floating gate polysilicon 124 and the isolation trenches |
| 905 | Substrate |
| 910 | Isolation trench |
| 1010 | Insulation in isolation trenches |
| 1103 | N-region isolating the substrate region 150 from below |
| 1105 | N-region isolating the substrate region 150 laterally on all sides |
| 1203 | Silicon nitride that serves as a stop layer during the etch of trench insulation 1010 |
| 1510 | Silicon dioxide insulating the floating gate sidewalls |
| 1810 | Gate oxide for select transistors |
| 2013 | Photoresist mask for patterning source line regions 144 |
| 2110 | Deep source line implant |
| 2401 | Source line and bitline region implant |

DESCRIPTION OF PREFERRED EMBODIMENTS

The description of the preferred embodiments is illustrative and not limiting. The invention is not limited by any particular dimensions, materials, processing steps, doping levels, crystal orientation, layer thicknesses, layouts, or any other features, unless expressly stated otherwise.

Figure 9A:
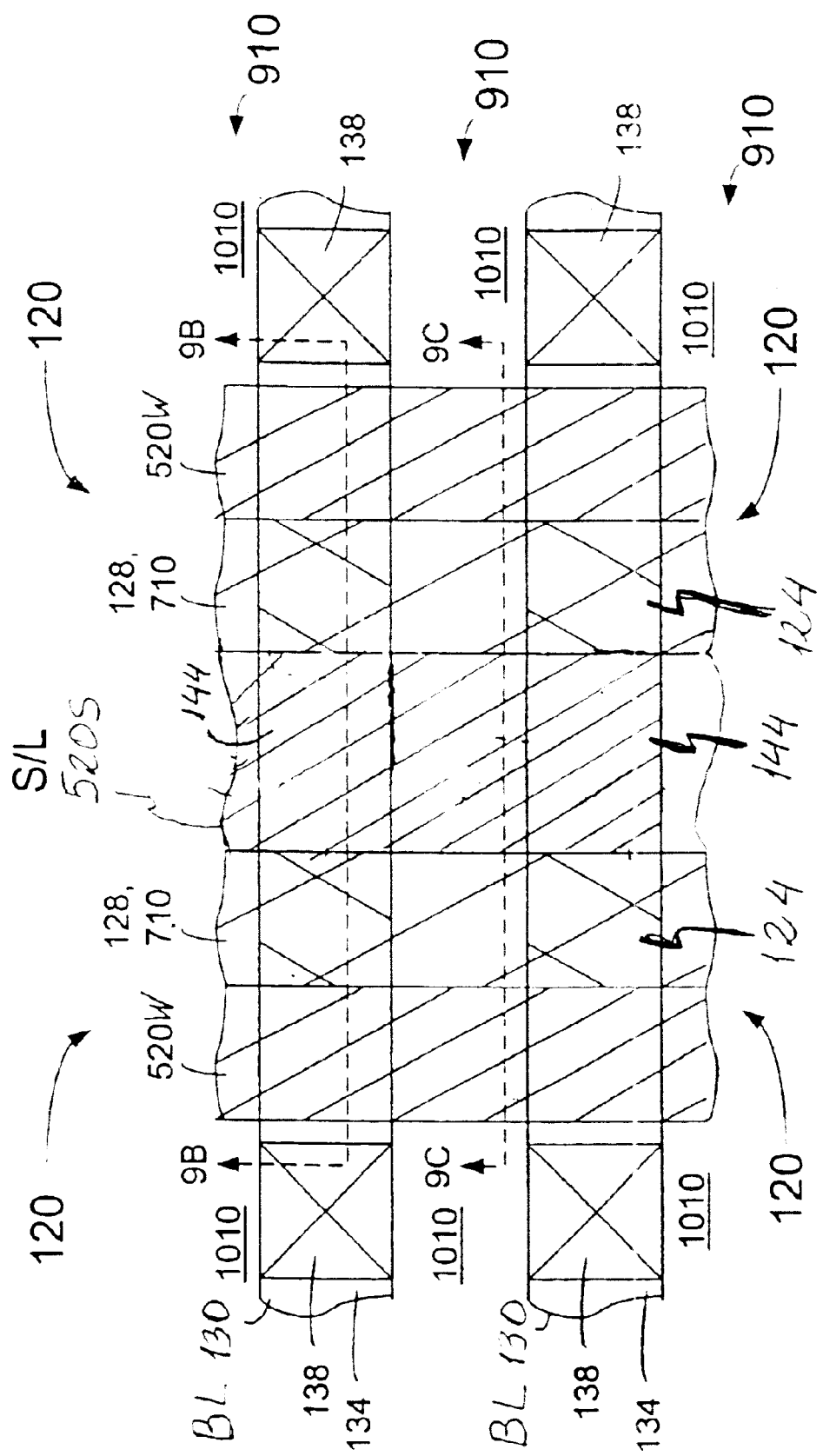
FIG. 9A is a top view of a memory according to some embodiments of the present invention.
Figure 9B:
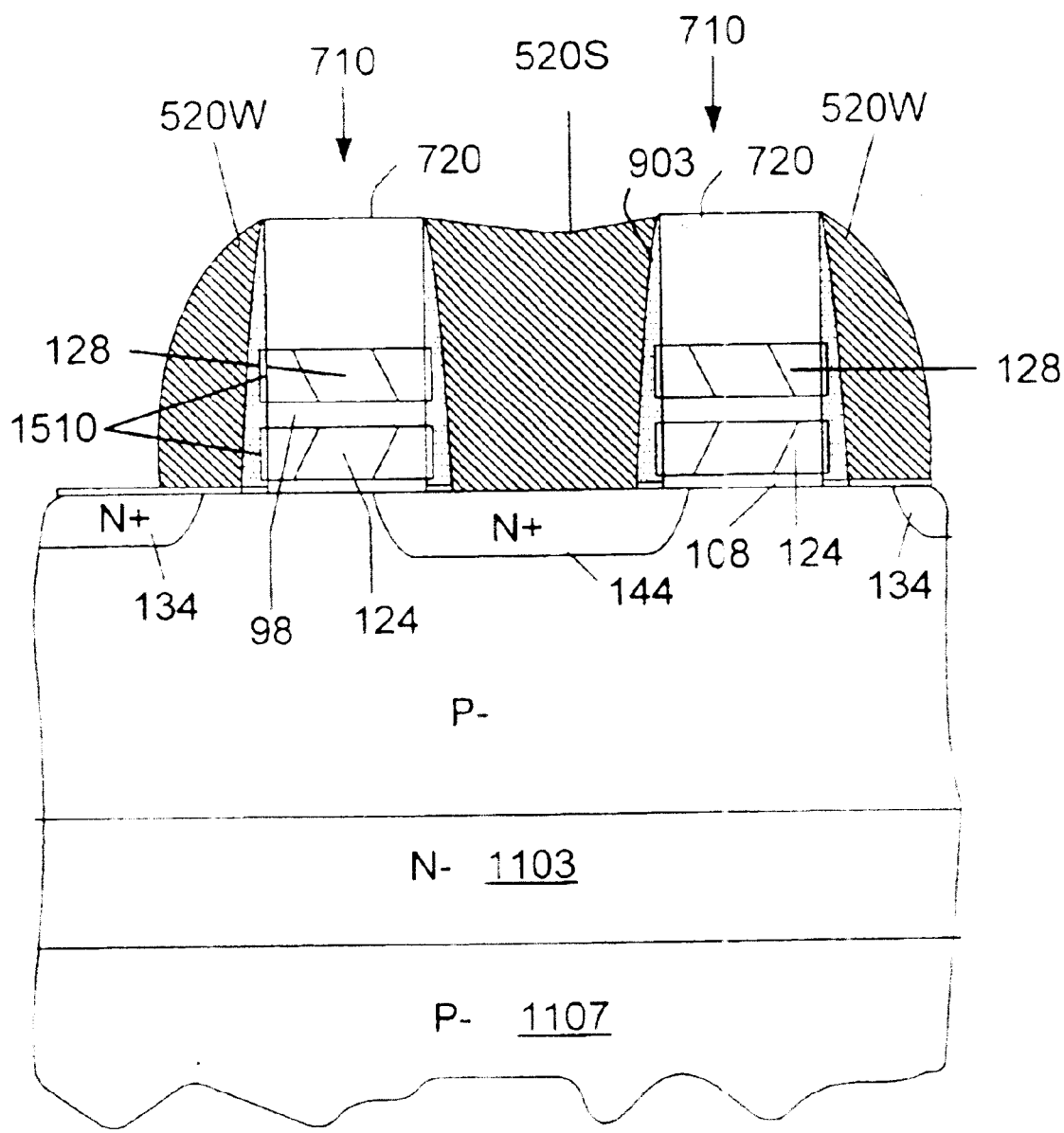
FIGS. 9B, 9C are cross section illustrations of the memory of FIG. 9A.
Figure 9C:
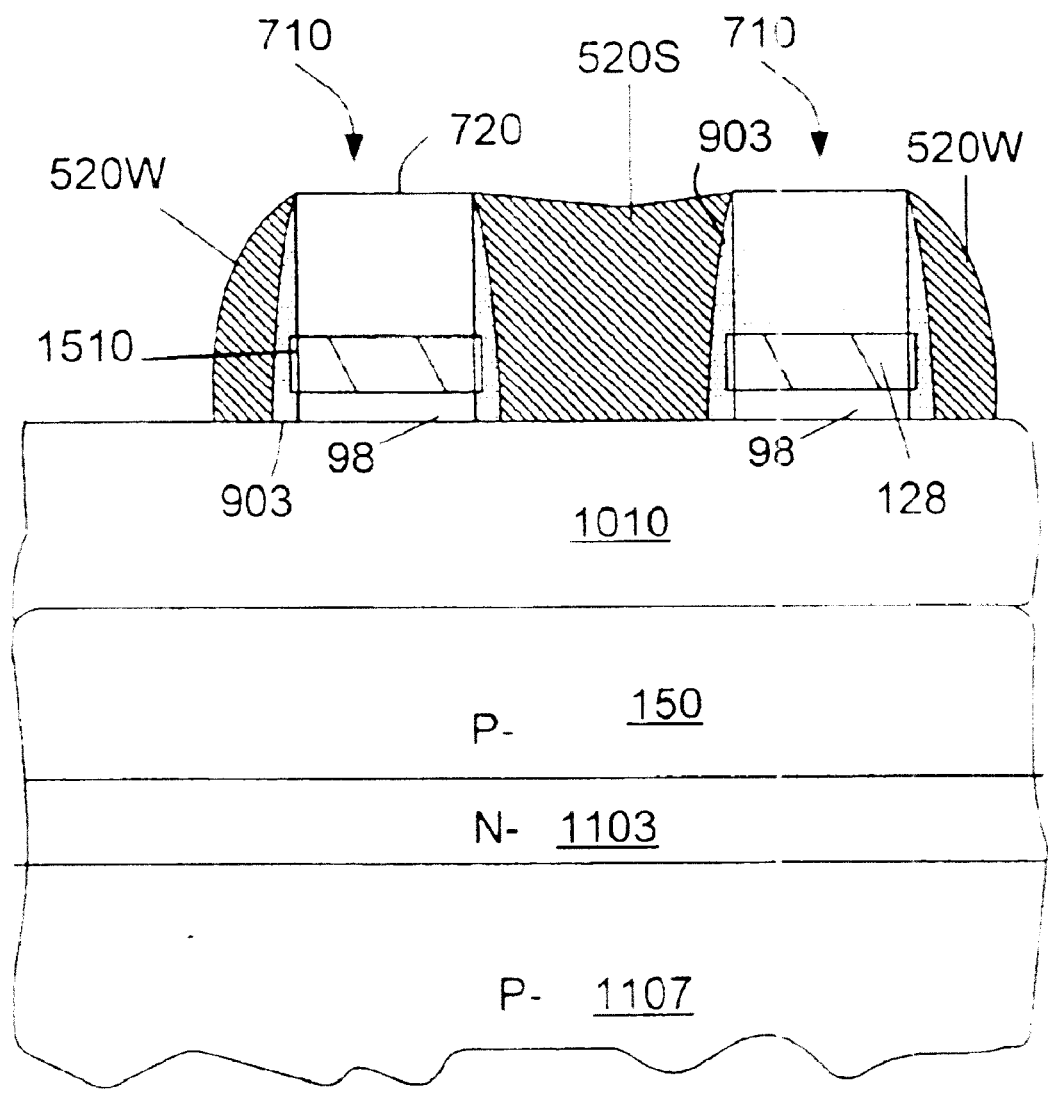
Figure 10A:
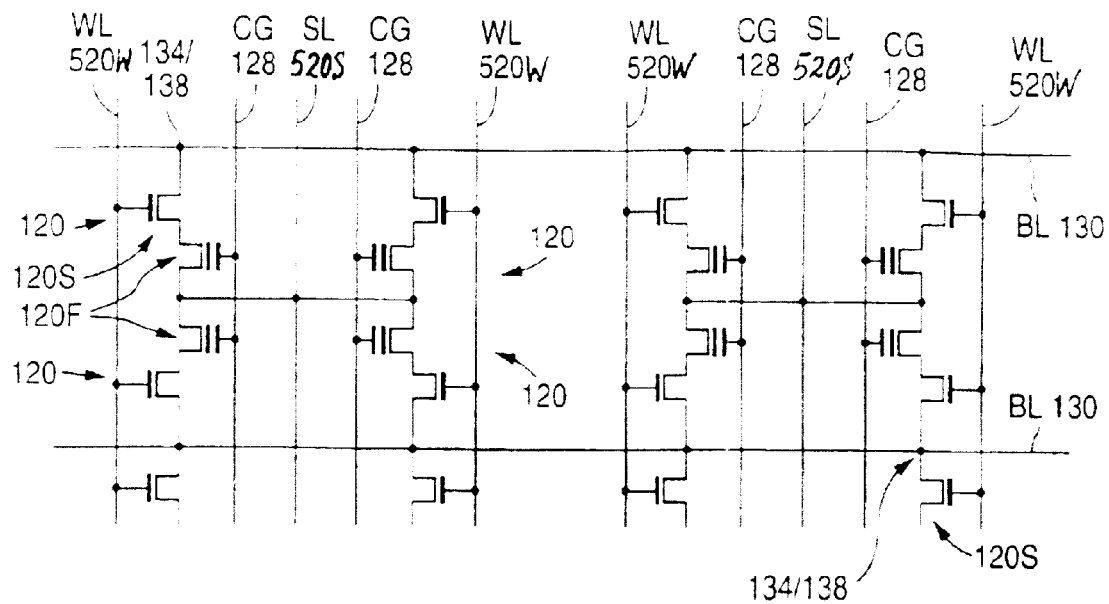
FIG. 10A is a circuit diagram of the memory of FIG. 9A.
Figure 10B:
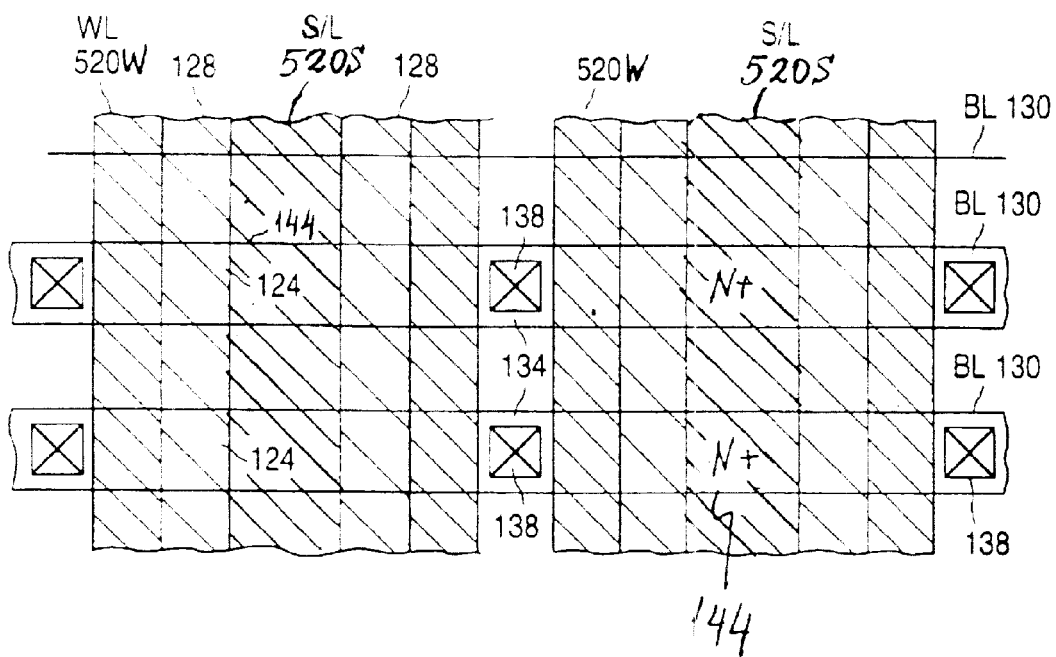
FIG. 10B is a top view of the memory of FIG. 9A.

FIG. 9A is a top view of a flash memory array of self-aligned triple-gate memory cells 120. FIG. 9B illustrates a cross section of the array along the line 9B–9B in FIG. 9A. FIG. 9C illustrates a cross section along the line 9C–9C in FIG. 9A. FIG. 10A is a circuit diagram of the array. FIG. 10B is a top view illustrating some additional features.

In FIGS. 9A, 10A, 10B, bitlines 130 extend horizontally. The bitlines are formed from a conductive layer overlying the memory cells (for example, aluminum or tungsten, not shown in FIGS. 9B, 9C). The bitlines contact the memory cells' bitline regions 134 in contact regions 138. Source lines 520S extend vertically between the adjacent row structures 710. The source lines 520S physically contact the memory cells' source line regions 144. Each row structure 710 includes a conductive control gate line 128 (e.g. doped polysilicon) extending vertically and providing control gates for a row of memory cells. Floating gates 124 (made of doped polysilicon, for example) underlie the control gates 128. Each floating gate extends between adjacent isolation trenches 910. Trenches 910 extend horizontally between the bitlines 130.

Each structure 710 is a self-aligned stack.

Conductive wordlines 520W (e.g. doped polysilicon) are perpendicular (or at some other angle) to the bitlines. Each wordline 520W provides select gates for a row of memory cells. Each wordline 520W is a self-aligned sidewall spacer formed over a sidewall of a corresponding stack 710. Wordlines 520W are insulated from the adjacent control gates 128 and floating gates 124 by silicon nitride spacers 903 and silicon dioxide 1510. Layers 903, 1510 can be formed without a mask.

As shown in FIG. 10A, each row of memory cells has two cells 120 between each two adjacent bitlines 130. Each row has a control gate line 128 and a wordline 520W. Two adjacent memory rows share a source line 144. In each memory cell 120, an NMOS select transistor 120S and a floating gate transistor 120F are connected in series. The gate of the select transistor 120S is provided by wordline 520W. The control gate of the transistor 120F is provided by line 128.

Each cell 120 can be erased by Fowler-Nordheim tunneling of electrons from its floating gate 124 (FIG. 9B) through silicon dioxide 108 to source line region 144 or substrate region 150. (Region 150 contains the channel regions of the memory cells.) The cell can be programmed by source-side hot electron injection. The term "source-side hot electron injection" assumes that a cell's bitline region 134 is called a "source". At other times, this region is called a drain, and the source line region 144 is called a source. Each of regions 134, 144 may also be called a source/drain region. The invention is not limited by any particular terminology.

Figure 11:
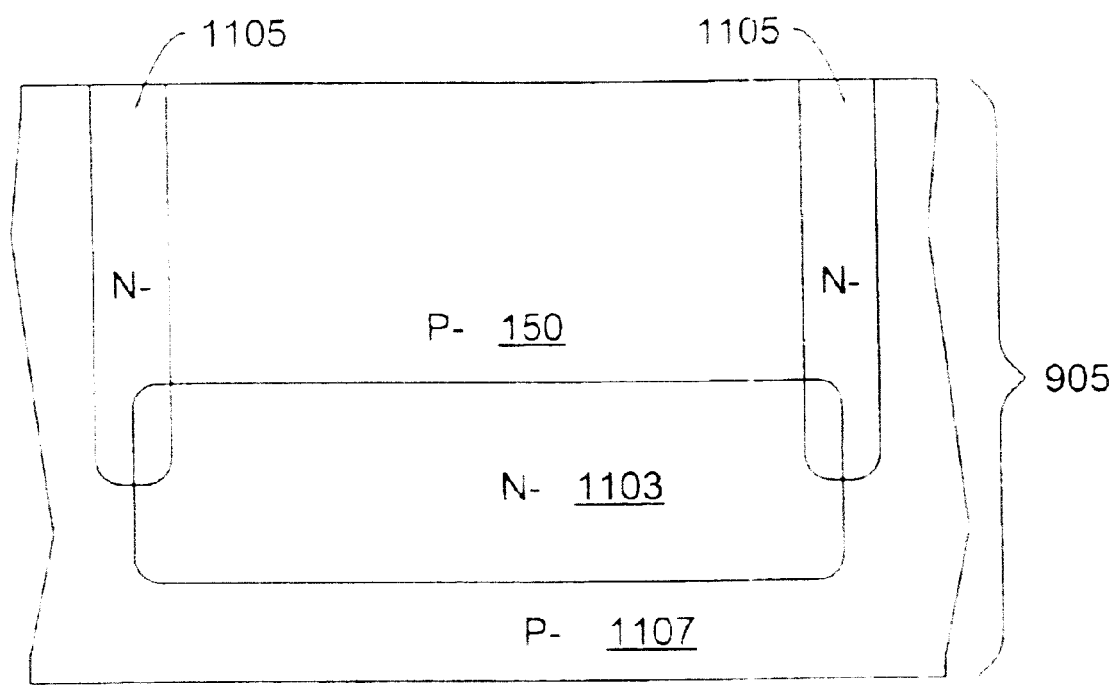
FIGS. 11, 12A are cross section illustrations of the memory of FIG. 9A at different stages of fabrication.

The beginning fabrication stages for one embodiment of the memory of FIGS. 9A–10B are identical to the respective fabrication stages of a memory described in U.S. patent application Ser. No. 09/640,139 filed on Aug. 15, 2000 by H. T. Tuan et al., entitled "Nonvolatile Memory Structures and Fabrication Methods", incorporated herein by reference. More particularly, the memory can be formed in and over an isolated P-type region 150 of monocrystalline silicon substrate 905 (FIG. 11). In one embodiment, region 150 is formed as follows. N type dopant is implanted into substrate 905 by ion implantation through a mask opening to form an N-region 1103 which insulates the region 150 from below. In a separate ion implantation step or series of steps, using another mask (not shown), N type dopant is implanted to form an N-region 1105 completely surrounding the region 150 on all sides. In some embodiments, this step creates also N wells (not shown) in which peripheral PMOS transistors will be formed for peripheral circuitry. Such circuitry may include sense amplifiers, input/output drivers, decoders, voltage level generators.

Regions 1103, 1105 are at a voltage equal to or above the voltage of substrate region 150 during memory operation. The areas 1107 of substrate 905 that surround the regions 1103, 1105 are at some voltage equal to or below the voltage of the regions 1103, 1105. In some embodiments, the regions 150, 1103, 1105 are shorted together, and the region 1107 is at ground.

The invention is not limited to a particular region 150 isolation technique, or to memories having an isolated substrate region.

Figure 12A:
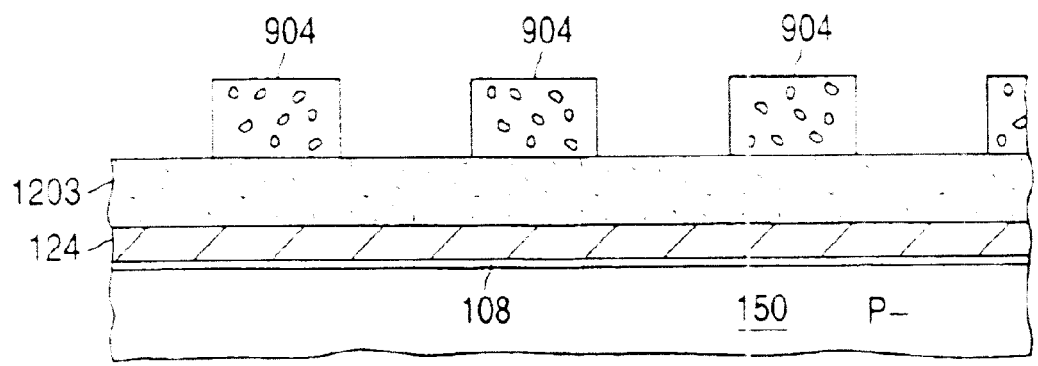

As shown in FIG. 12A, silicon dioxide 108 (tunneling oxide) is grown on substrate 905 by thermal oxidation. In some embodiments, the oxide is grown to a thickness of 9 nm.

Conductive polysilicon layer 124 is formed on oxide 108. In some embodiments, polysilicon 124 is deposited to a thickness of 120 nm by LPCVD (low pressure chemical vapor deposition), and is lightly doped (N type) during or after deposition. Layer 124 will provide the floating gates and, possibly, other circuit elements as needed for the peripheral circuitry. Such elements may include interconnects, transistor gates, resistors, capacitor plates.

Figure 12B:
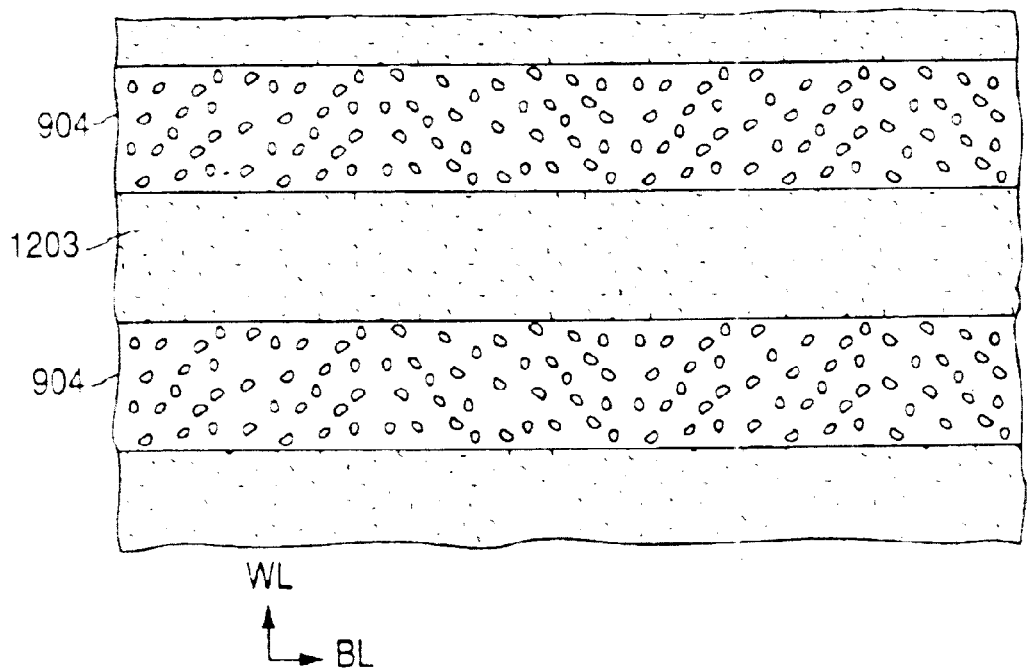
FIG. 12B is a top view of the structure of FIG. 12A.

Silicon nitride 1203 is deposited over polysilicon 124. In some embodiment, nitride 1203 is deposited to a thickness of 120 nm by LPCVD. Photoresist mask 904 is formed photolithographically over nitride 1203. Nitride 1203 and polysilicon 124 are etched through the mask openings to form strips extending in the bitline direction through the memory array. In the top view of FIG. 12B, the "BL" axis indicates the bitline direction. The "WL" axis indicates the wordline direction.

A misalignment of mask 904 does not affect the cell geometry and hence may have to be accommodated, if at all, only at the array boundaries and in the peripheral areas (the areas in which the peripheral circuitry is located).

Figure 13:
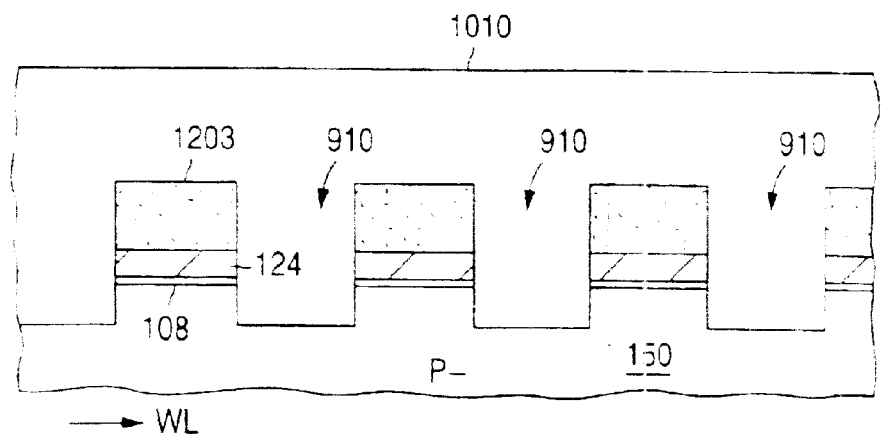
FIGS. 13–15, 16A, 16B, 17A, 17B, 18A, 18B, 19A, 19B, 20A, 20B, 21, 22A, 22B, 23 are cross section illustrations of memory embodiments of the present invention.

After the polysilicon etch, oxide 108 and substrate region 150 are etched through the openings in mask 904 to form isolation trenches 910 (FIG. 13). Isolation trenches for the peripheral circuitry (not shown) are also formed in this step. In some embodiments, the trench depth is 0.25 μm.

Then mask 904 is removed.

Whenever a masked etch of two or more layers is described herein, it is assumed, unless stated otherwise, that only the top layer may be etched using the mask. After the top layer is etched, the mask may be removed, and the remaining layers may be etched with the top layer as a mask, or even without a mask. For example, after the etch of nitride 1203, the mask 904 may be removed, and then polysilicon 124, oxide 108 and substrate 150 can be etched with nitride 1203 as a mask. Nitride 1203 may also be etched but is not completely removed.

Trench insulation 1010 (FIG. 13) fills the trenches 910 and covers the wafer. In some embodiments, insulation 1010 is formed as follows. A 13.5 nm layer of silicon dioxide is grown on the exposed surfaces of trenches 910 by a well-known RTO (rapid thermal oxide) process. Then a 480 nm layer of silicon dioxide is deposited by chemical vapor deposition (CVD) using high density plasma (HDP).

Figure 14:
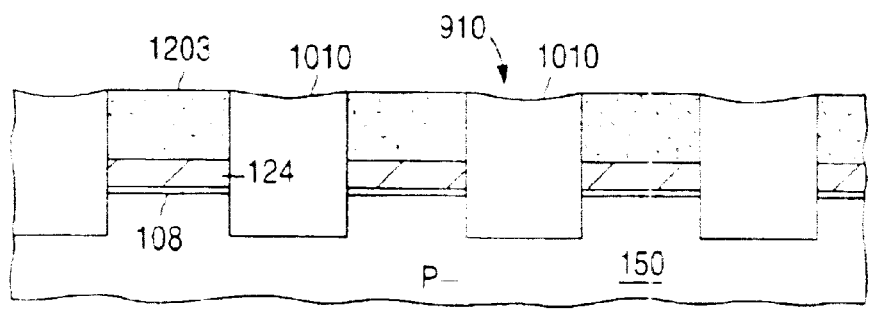
Figure 15:
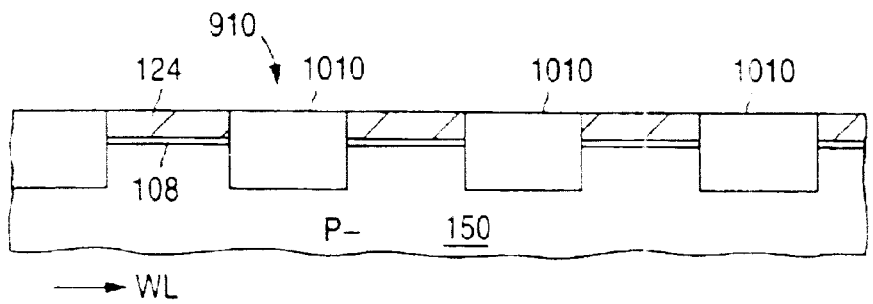

Trench insulation 1010 is subjected to chemical mechanical polishing (CMP) and/or some blanket etch process, until silicon nitride 1203 is exposed (FIG. 14). Nitride 1203 acts as a stop layer during this step. Then nitride 1203 is removed (by a wet etch, for example). Optionally, insulation 1010 is etched down also. The resulting structure may have a planar top surface as shown in FIG. 15. Alternatively, the etch of insulation 1010 may expose the sidewalls of polysilicon 124. This may improve the efficiency of the memory cells, as explained in the aforementioned U.S. patent application Ser. No. 09/640,139.

Figure 16A:
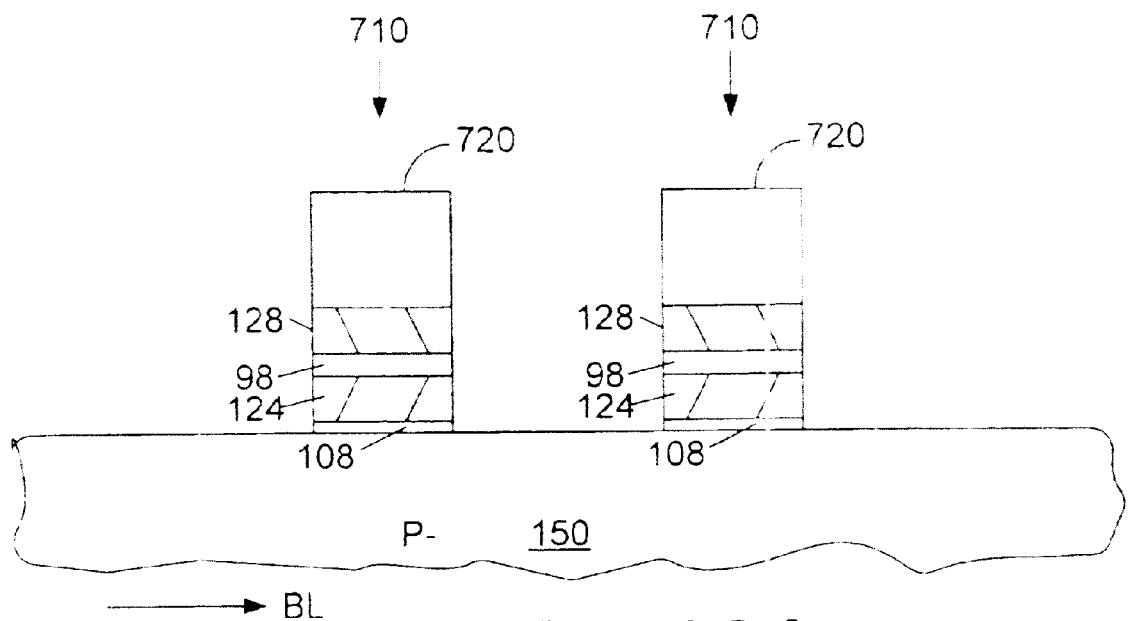
Figure 16B:
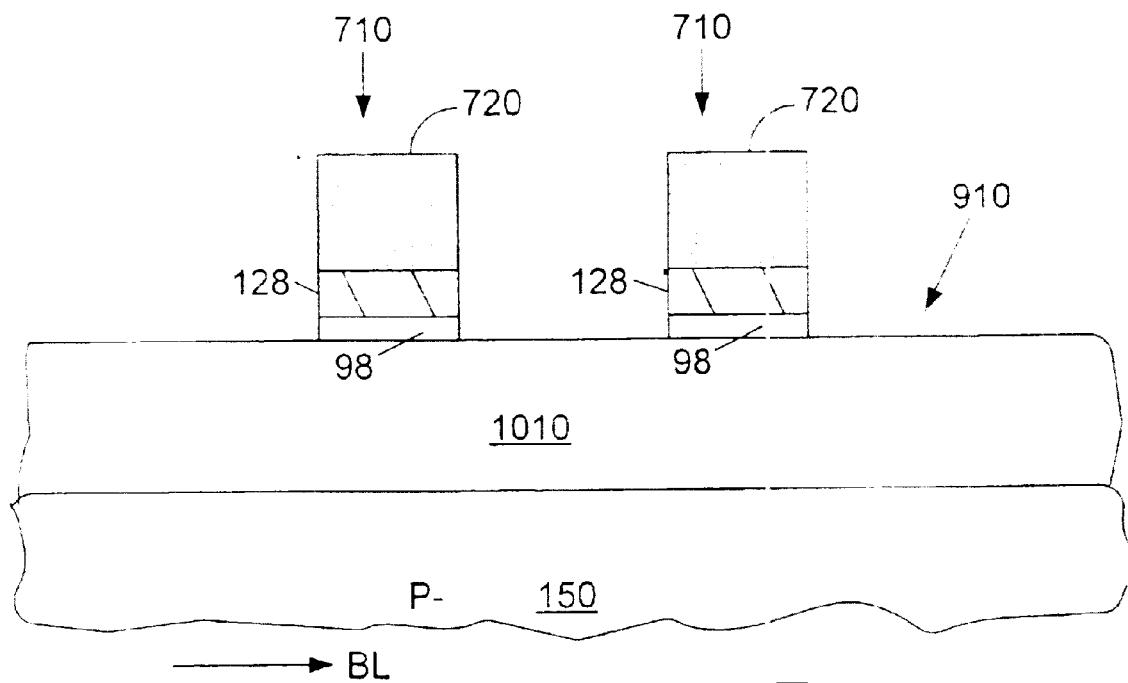
Figure 17A:
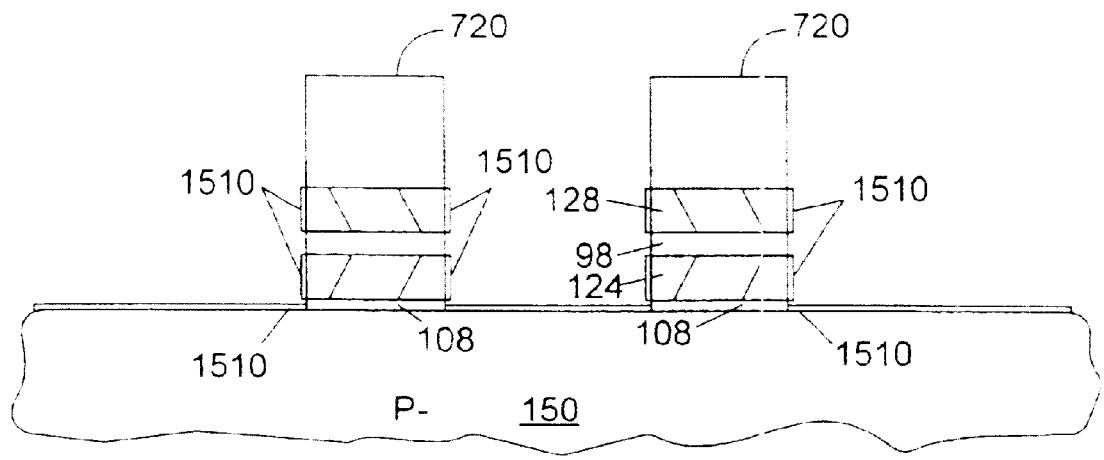
Figure 17B:
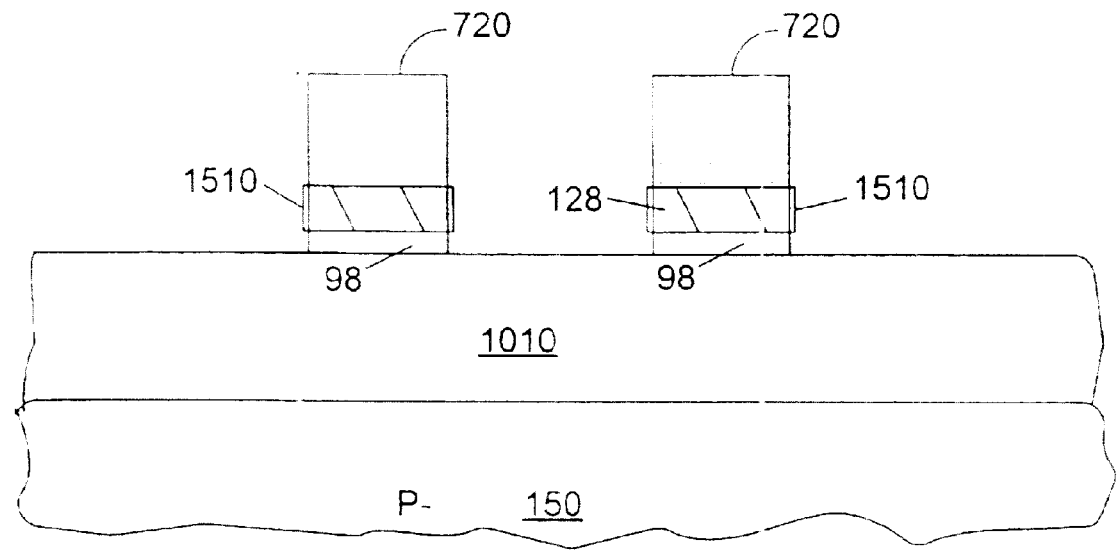
Figure 18A:
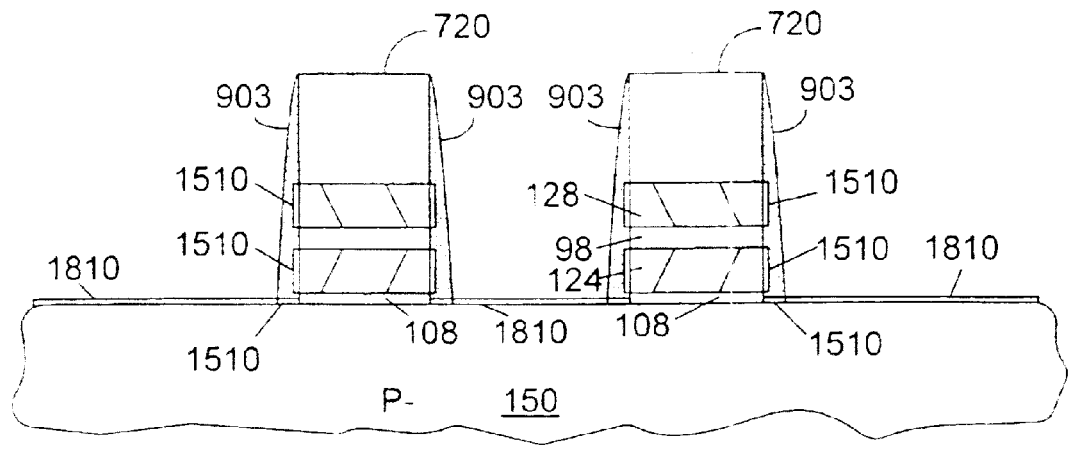
Figure 18B:
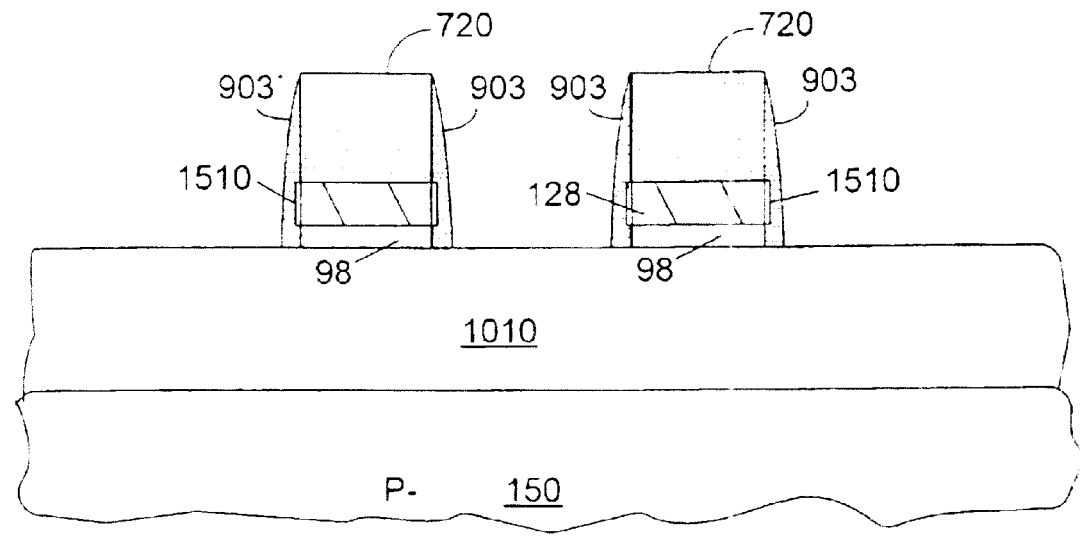

Then insulation 98 is formed. See FIGS. 9B, 9C, 16A, 16B. FIGS. 16A, 16B show memory array cross sections by planes parallel to the bitlines. In FIG. 16A, the cross section is taken between trenches 910. In FIG. 16B, the cross sectional plane passes through a trench 910.

Similarly, FIGS. 17A, 18A, 19A, 20A, 21, 22A, 23 illustrate cross sections taken between the trenches. FIGS. 17B, 18B, 19B, 20B, 22B illustrate cross sections taken along a trench 910.

In some embodiments, the insulation 98 is ONO (oxide-nitride-oxide).

Layer 128 is formed on insulation 98. In some embodiments, layer 128 is polysilicon deposited by LPCVD and doped N+ or P+ during or after deposition. In other embodiments, layer 128 is polysilicon covered by tungsten silicide. Other conductive materials can also be used.

A photoresist layer (not shown) is deposited and patterned photolithographically into a mask that contains strips extending in the wordline direction over the memory array. This mask defines stacks 710 (FIGS. 9A, 9B, 9C, 16A, 16B). This mask can also be used to pattern the polysilicon 128 and silicon nitride 720 in the peripheral areas (not shown) as described in the aforementioned U.S. patent application Ser. No. 09/640,139. Layer 128 may provide transistor gates, interconnects, and other features in the peripheral areas. A misalignment of this resist mask does not change the geometry of the memory cells and hence may have to be accommodated only at the boundaries of the memory array and in the peripheral areas.

Layers 720, 128, 98, 124, 108 are etched to define the stacks 710. The resulting memory array cross sections are shown in FIGS. 16A, 16B.

The structure is oxidized (e.g. by RTO, i.e. rapid thermal oxidation). As a result, silicon dioxide 1510 (FIGS. 17A, 17B) is grown on the exposed surface of substrate region 150 to a thickness of 5 nm. This operation also results in oxidation of the exposed sidewalls of polysilicon layers 124, 128. The horizontal thickness of oxide 1510 on the polysilicon sidewalls is 8 nm.

A thin conformal layer 903 of silicon nitride (FIGS. 18A, 18B) is deposited to a 20 nm thickness by LPCVD. Layer 903 is etched anisotropically without a mask to form spacers over the sidewalls of stacks 710.

This etch also removes exposed portions of oxide 1510. Silicon dioxide is regrown on substrate region 150. This oxide, shown at 1810 in FIG. 18A, will provide gate dielectric for the select transistors. An exemplary thickness of oxide 1810 is 5 nm.

In some embodiments, either nitride 903 or oxide 1510 is omitted.

A conductive layer 520.1 (FIGS. 19A, 19B) is formed over the wafer. In some embodiments, layer 520.1 is polysilicon deposited by LPCVD and heavily doped during or after deposition. An exemplary thickness of layer 520.1 is 50 to 100 nm. Other thicknesses can also be used.

Figure 19A:
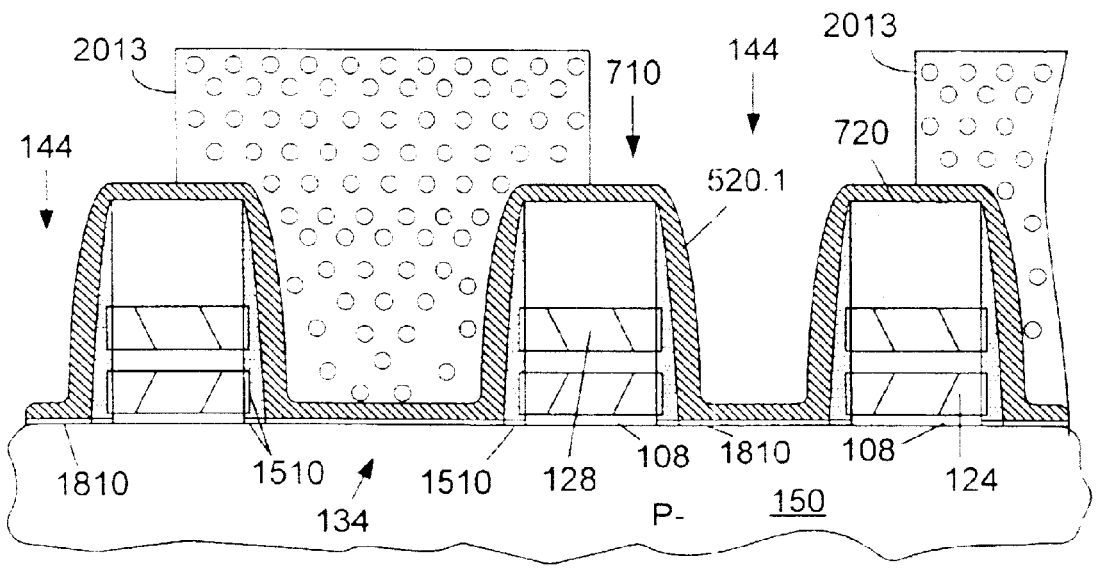
Figure 19B:
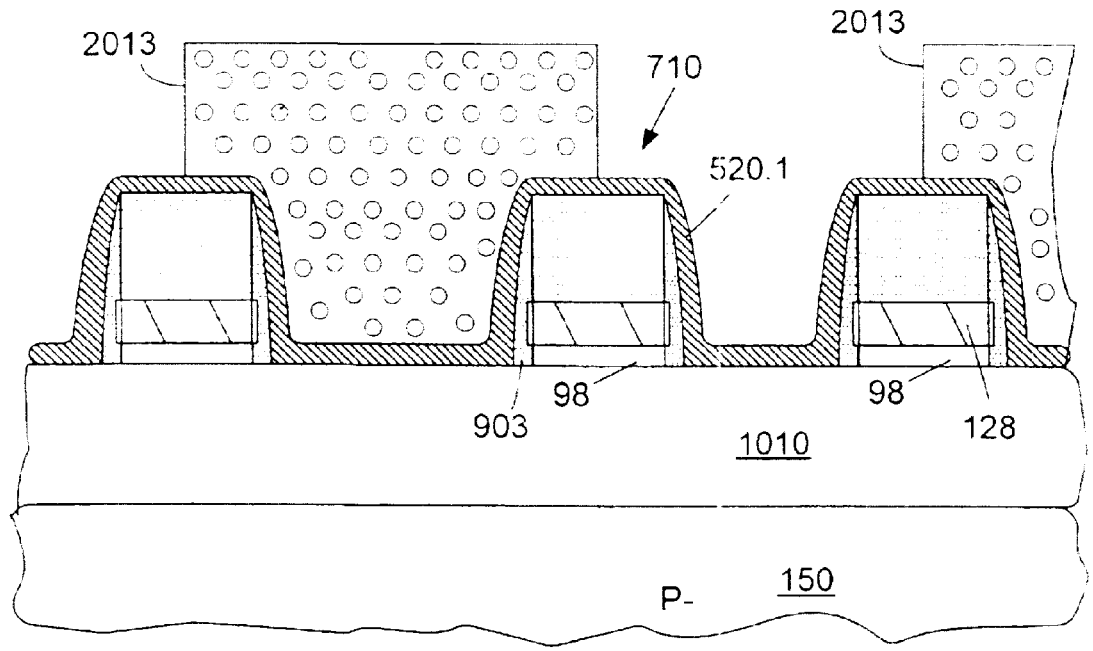

Photoresist mask 2013 is formed over the wafer and patterned photolithographically to expose the areas in which the source line regions 144 will be formed. See also FIGS. 20A, 20B. In the embodiment of FIGS. 19A, 19B, the mask exposes regions extending throughout the memory array between two adjacent stacks 710. The longitudinal edges of mask 2013 can be positioned anywhere over the respective stacks 710, so their positioning is not critical if the mask alignment tolerance is not more than one half of the width of a stack 710. In some embodiments, the minimal feature size is 0.14 μm. The mask alignment tolerance is 0.07 μm. The width of each stack 710 is 0.14 μm, that is, twice the alignment tolerance.

Polysilicon 520.1 and oxide 1810 are removed from the areas exposed by the mask. Trench insulation 1010 in the exposed areas may be slightly reduced in thickness during the etch of oxide 1810.

Figure 20A:
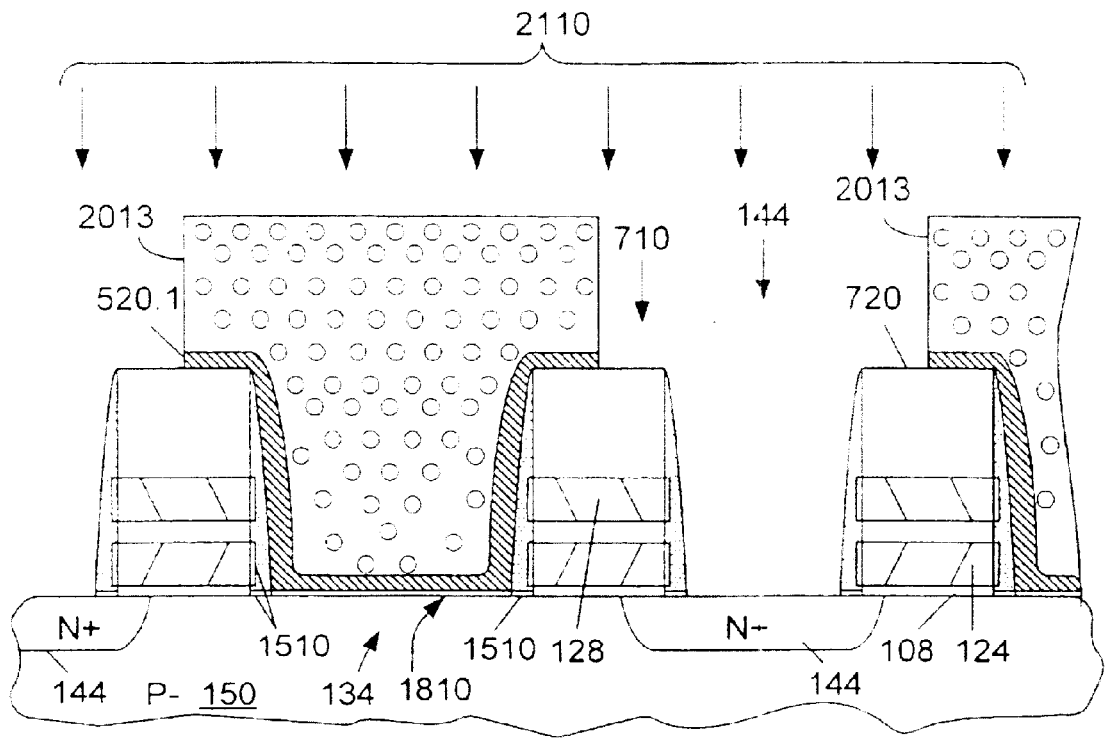

After the oxide etch, mask 2013 remains in place as N type dopant (e.g. phosphorus) is implanted into the wafer to heavily dope (N+) the source line regions 144, as shown by arrows 2110 in FIG. 20A. This is a "deep" implant done to enable the source lines to carry high voltages for erase and/or programming operations. The deep implant will also provide a suitable overlap between the doped source line regions and the floating gates 124 when the dopant diffuses laterally (as shown in FIG. 20A).

Figure 20B:
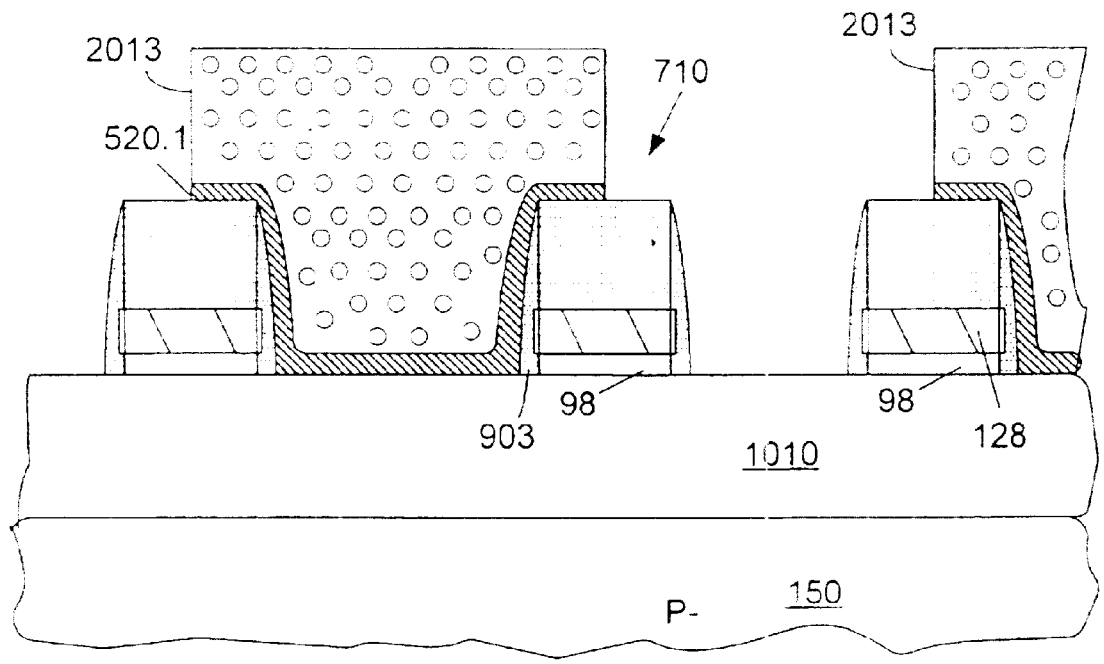
Figure 21:
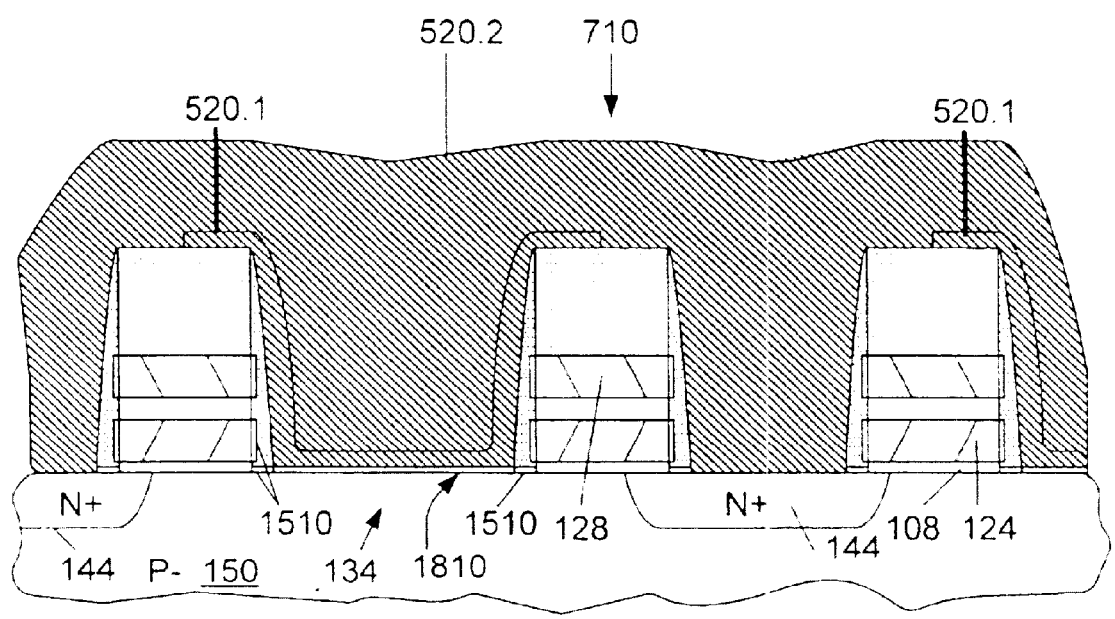

In some embodiments, the dopant does not penetrate the insulation 1010, so the bottoms of trenches 910 are not doped (see FIG. 20B). Whether or not the dopant penetrates the insulation 1010, insulation 1010 prevents the dopant from coming close or reaching the N-region 1103 (FIG. 11). Therefore, a high leakage current or a short between the source lines 144 and the region 1103 is avoided. In some embodiments, the top surface of region 1103 at the end of fabrication (after thermal steps) is about 1 μm below the top surface of substrate 905 (of region 150). The trench depth is 0.25 μm.

Then the resist 2013 is removed. Polysilicon 520.1 protects the oxide 1810 over the bitline regions 134 during the removal of resist 2013 and a subsequent wafer cleaning operation.

In some embodiments, the resist 2013 is removed before the implant 2110. Polysilicon 520.1 acts as a mask during the implant.

In some embodiments, the implant 2110 is performed before the etch of polysilicon 520.1 or oxide 1810. The implant is performed through the polysilicon or the oxide or both. In some embodiments, layer 520.1 is omitted.

Figure 22A:
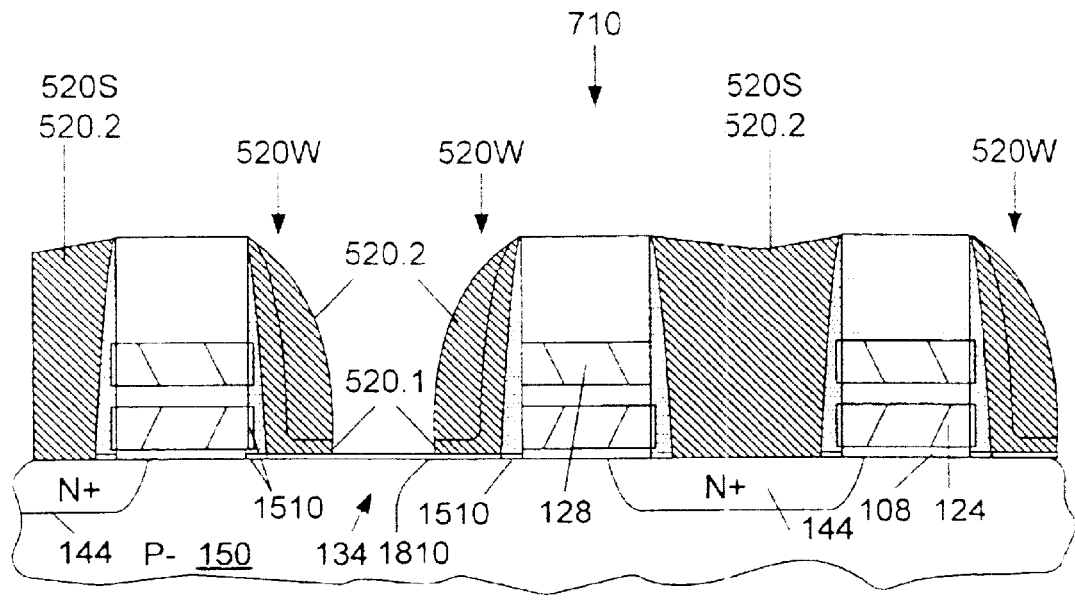
Figure 22B:
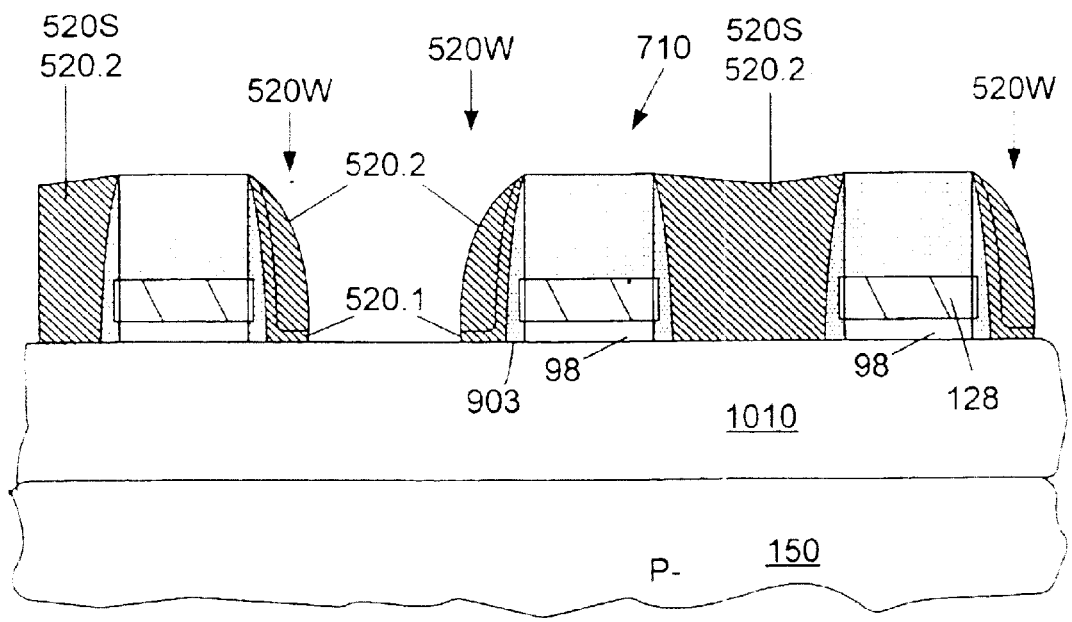
Figure 23:
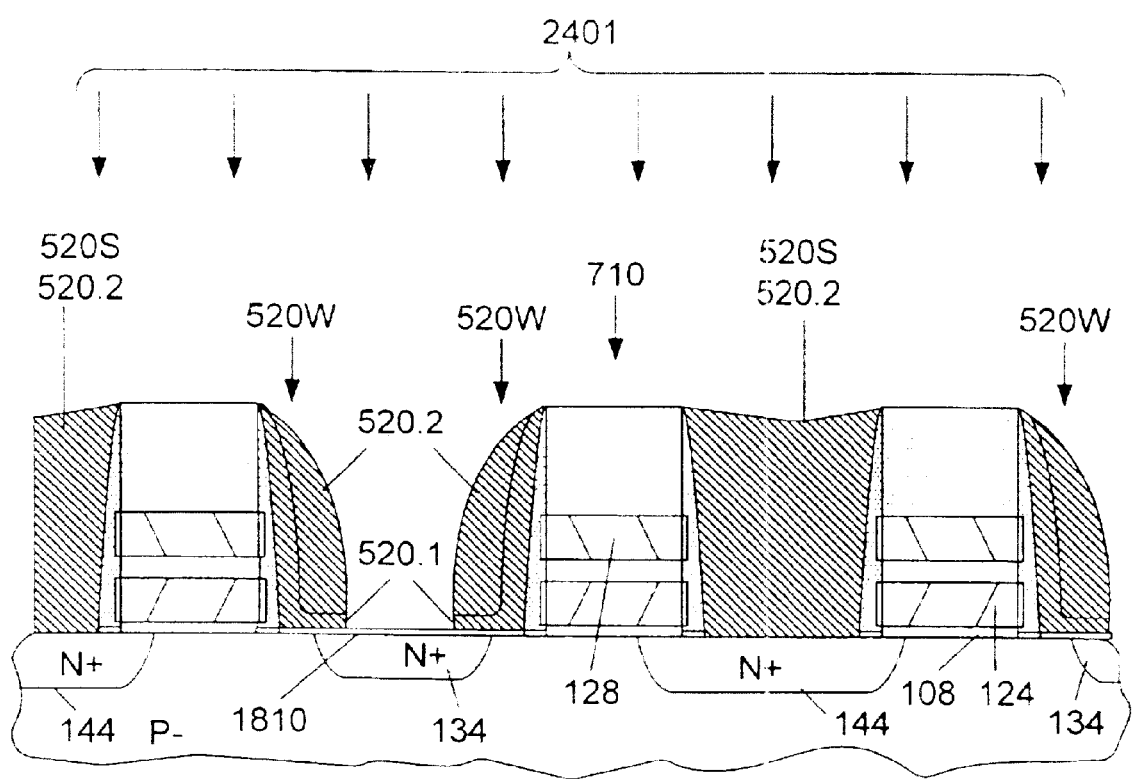

Conductive polysilicon layer 520.2 (FIG. 21) is formed. In some embodiments, polysilicon 520.2 is deposited by LPCVD to a thickness of 300 nm, and is heavily doped during or after deposition. The dopant type (N+ or P+) is the same as for layer 520.1. Layers 520.1, 520.2 are subjected to a blanket anisotropic etch (e.g. RIE) to form spacers 520W over the sidewalls of stacks 710 on the side of the bitline regions 134 (FIGS. 22A, 22B). Layers 520.1, 520.2 are etched off the top of stacks 710. The vertical thickness of nitride 720 and polysilicon layers 520.1, 520.2, can be adjusted to control the width of the polysilicon spacers.

Polysilicon plugs 520S formed by polysilicon 520.2 fill the gaps between adjacent stacks 710 on the side of source line regions 144. Each polysilicon plug 520S forms a source line extending through the memory array and physically contacting the underlying source line regions 144. The bottom surface of each plug 520S physically contacts the trench insulation 1010. We will sometimes refer to polysilicon layers 520.1, 520.2 collectively as layer 520.

In addition to the wordlines and source lines, layer 520 can provide interconnects, transistor gates, and other circuit elements for the peripheral circuitry. For that purpose, layer 520 can be masked in the peripheral areas before it is etched. No such masking is needed over the memory array.

In some embodiments, polysilicon 520.2 does not entirely fill the regions between adjacent stacks 710 over the source line regions 144. Polysilicon 520.2 may be recessed relative to the top of the stacks 710. In some embodiments, polysilicon 520.2 forms spacers over the sidewalls of stacks 710 over the regions 144. In this case, a source line 520S consists of two such spacers shorted together by regions 144.

A blanket N+ implant 2401 (FIG. 23) is performed to dope the bitline regions 134. Stacks 710, polysilicon 520, and trench insulation 1010 mask the substrate during this implant. Polysilicon 520 is also implanted during this step.

This implant does not penetrate insulation 1010, so the bitline regions 134 are not shorted together.

Memory fabrication can be completed using known techniques. Insulating layers (not shown) can be deposited. Contact openings such as 138 (FIG. 9A) can be formed. Conductive materials can be deposited and patterned to provide bitlines and other features as needed.

The gates of peripheral transistors can be formed from polysilicon layer 128 or 520. See the aforementioned U.S. patent application Ser. No. 09/640,139. In some embodiments, some of the peripheral transistor gates or other features are formed using layer 128, while other peripheral gates or features are formed using layer 520.

In some embodiments, source lines 520S are silicided to reduce their resistance. The silicidation can be performed using the source line silicidation techniques described in U.S. patent application Ser. No. 09/640,139.

Figure 24:
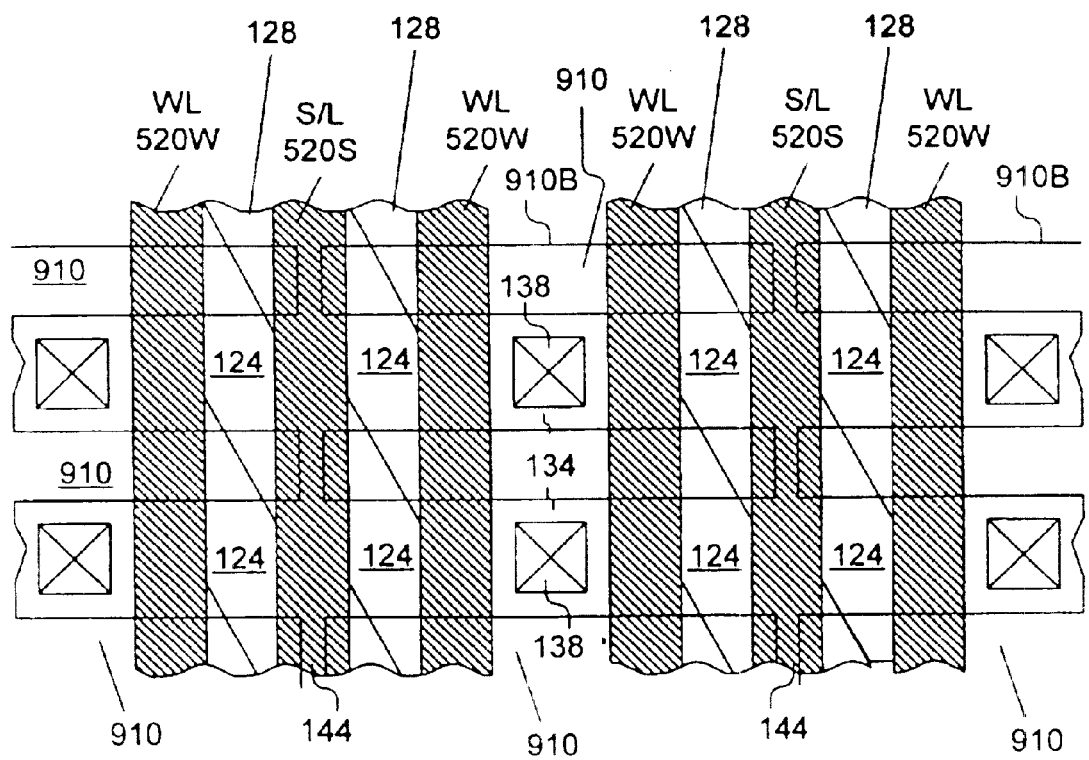
FIG. 24 is a top view of a memory embodiment of the present invention.

FIG. 24 illustrates another flash memory array according to the present invention. Each isolation trench 910 extends between adjacent source line regions 144 but does not cross the source line regions. The boundaries of the isolation trenches are shown at 910B.

This memory can be fabricated as follows. The substrate doping and the trench isolation can be performed as described in U.S. patent application Ser. No. 09/640,139. For example, trenches 910 can be defined by resist 904 (FIG. 12A) or by a combination of resist 904 with another resist layer.

The remaining fabrication steps can be identical to those described above in connection with FIGS. 16A–23.

In some embodiments of FIGS. 9A through 24, a memory cell is programmed (rendered non-conductive) via source-side hot electron injection. See W. D. Brown et al., "Nonvolatile Semiconductor Memory Technology" (1998), pages 21–23.

A memory cell can be erased using Fowler-Nordheim tunneling from floating gate 124 to source line region 144 or to substrate region 150.

A memory may have multiple memory arrays, each with its own bitlines and wordlines. Different arrays may be fabricated in the same substrate region 150 or in different isolated regions 150 in the same integrated circuit.

The invention is not limited to the embodiments described above. The invention is not limited to any particular erase or programming mechanisms (e.g. Fowler-Nordheim or hot electron injection). The invention covers non-flash EEPROM memories and other memories, known or to be invented. The invention is not limited to the materials described. In particular, control gates, select gates, and other conductive elements can be formed from metals, metal silicides, polycides, and other conductive materials and their combinations. Silicon dioxide and silicon nitride can be replaced with other insulating materials. P and N conductivity types can be interchanged. The invention is not limited to any particular process steps or order of steps. For example, in some embodiments, thermal oxidation of silicon can be replaced with depositing silicon dioxide or some other insulator by chemical vapor deposition or some other technique, known or to be invented. The invention is not limited to silicon integrated circuits. Other embodiments and variations are within the scope of the invention, as defined by the appended claims.

What is claimed is:

1. A semiconductor integrated circuit comprising a memory comprising:

one or more pairs of first structures positioned over a semiconductor substrate, wherein each first structure comprises (a) a plurality of floating gates of memory cells and (b) a first conductive line providing control gates for the memory cells, the control gates in each first structure overlying the floating gates of the first structure;

wherein for each pair of structures (S1, S2), the structure S1 has a first sidewall facing the structure S2 and has a second sidewall opposite from the first sidewall, and the structure S2 has a first sidewall facing the structure S1 and a second sidewall opposite from the first sidewall;

wherein for each pair of first structures S1, S2, the memory comprises:

(1) a plurality of first doped regions in the semiconductor substrate, each first doped region providing a first source/drain region to a memory cell having floating and control gates in the structure S1 and also providing a first source/drain region to a memory cell having floating and control gates in the structure S2; and (2) a second conductive line formed over the semiconductor substrate, wherein a bottom surface of the second conductive line extends between the first structures S1 and S2 below the top surfaces of the structures S1 and S2 and physically contacts the first doped regions which provide the first source/drain regions to the memory cells having floating and control gates in said pair of the structures S1, S2;

wherein the memory further comprises a plurality of third conductive lines, wherein for each first structure, one of the third conductive lines is adjacent to the second sidewall of the first structure to provide conductive gates to the memory cells having the floating and control gates in the first structure, the conductive gates being insulated from the floating and control gates.

2. The integrated circuit of claim 1 wherein for each pair of the first structures, the first doped regions which provide the first source/drain regions to the memory cells having floating and control gates in the structures of the pair are separated from each other by insulation regions recessed into the semiconductor substrate.

3. The integrated circuit of claim 2 wherein for each pair of the first structures (S1, S2), the top surface of the insulation regions that separate the corresponding first doped regions which provide the first source/drain regions to the memory cells having floating and control gates in the structures of the pair (S1, S2) is below the bottom surface of the first conductive lines and wherein the corresponding second conductive line overlies and physically contacts the insulation regions between the first structures of the pair (S1, S2).

4. The integrated circuit of claim 1 wherein for each pair (S1, S2) of the first structures, the bottom surface of the corresponding second conductive line is below the first conductive lines everywhere between the first structures of the pair (S1, S2).

5. The integrated circuit of claim 1 wherein for each pair (S1, S2) of the first structures, the corresponding second conductive line forms a conductive plug at least partially filling a region between the structures S1, S2 of the pair.

6. The integrated circuit of claim 1 wherein the substrate does not provide a conductive path to electrically interconnect the first doped regions adjacent to the first sidewalls of any two given first structures.

7. The integrated circuit of claim 1 wherein each second conductive line is a spacer on the first sidewall of one of the first structures.

8. The integrated circuit of claim 7 wherein the one or more second conductive lines include two spacers on respective two adjacent first sidewalls of two first structures, the spacers being separated from each other.

9. The integrated circuit of claim 1 further comprising a dielectric insulating the third conductive lines from the semiconductor substrate.

10. The integrated circuit of claim 1 further comprising:
a plurality of second doped regions in the semiconductor substrate, the second doped regions providing second source/drain regions to the memory cells of the memory array; and
a plurality of bit lines each of which passes across a plurality of the first conductive lines and electrically contacts a plurality of the second doped regions.

11. The integrated circuit of claim 1 further comprising:
a plurality of second doped regions in the semiconductor substrate, the second doped regions providing second source/drain regions to the memory cells of the memory array; and
a plurality of bit lines each of which passes across a plurality of the second conductive lines and electrically contacts a plurality of the second doped regions.

12. The integrated circuit of claim 1 further comprising:
a plurality of second doped regions in the semiconductor substrate, the second doped regions providing second source/drain regions to the memory cells of the memory array; and
a plurality of bit lines each of which is perpendicular to the third conductive lines and electrically contacts a plurality of the second doped regions.

* * * * *